United States Patent
Huang et al.

(10) Patent No.: US 8,508,834 B2
(45) Date of Patent: Aug. 13, 2013

(54) PRINTABLE PHOTOVOLTAIC ELECTROCHROMIC DEVICE AND MODULE

(75) Inventors: Lee-May Huang, Hsinchu (TW); Chi-Wei Hu, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 126 days.

(21) Appl. No.: 13/293,131

(22) Filed: Nov. 10, 2011

(65) Prior Publication Data

US 2012/0140310 A1 Jun. 7, 2012

(30) Foreign Application Priority Data

Dec. 1, 2010 (TW) .............................. 99141792 A

(51) Int. Cl.
G02F 1/153 (2006.01)
H01L 31/042 (2006.01)

(52) U.S. Cl.
USPC ........................ 359/273; 359/265; 136/244

(58) Field of Classification Search
CPC ................................................ H01L 27/1423
USPC ............... 136/244, 252, 256; 359/265, 267, 359/273
See application file for complete search history.

(56) References Cited

U.S. PATENT DOCUMENTS

| | | | |
|---|---|---|---|
| 4,960,323 A * | 10/1990 | Demiryont | 359/275 |
| 5,159,031 A | 10/1992 | Epstein et al. | |
| 5,253,100 A | 10/1993 | Yang et al. | |
| 5,377,037 A | 12/1994 | Branz et al. | |
| 5,384,653 A | 1/1995 | Benson et al. | |
| 5,805,330 A | 9/1998 | Byker et al. | |
| 6,045,643 A | 4/2000 | Byker et al. | |
| 6,055,089 A | 4/2000 | Schulz et al. | |
| 6,066,018 A | 5/2000 | Grupp et al. | |
| 6,067,184 A | 5/2000 | Bonhote et al. | |
| 6,118,572 A | 9/2000 | Kostecki et al. | |
| 6,369,934 B1 | 4/2002 | Bechinger et al. | |
| 6,433,913 B1 | 8/2002 | Bauer et al. | |
| 6,734,305 B2 | 5/2004 | Pierre et al. | |
| 7,855,822 B2 * | 12/2010 | Huang et al. | 359/275 |
| 8,188,361 B2 * | 5/2012 | Huang | 136/244 |
| 8,345,344 B2 * | 1/2013 | Huang | 359/265 |
| 2007/0139756 A1 * | 6/2007 | Agrawal et al. | 359/265 |
| 2009/0058353 A1 | 3/2009 | Jung | |
| 2009/0255576 A1 | 10/2009 | Tischler | |
| 2009/0301546 A1 | 12/2009 | Sinsabaugh | |
| 2010/0000590 A1 | 1/2010 | Huang | |
| 2010/0294335 A1 * | 11/2010 | Huang et al. | 136/244 |
| 2011/0286071 A1 * | 11/2011 | Huang et al. | 359/265 |

OTHER PUBLICATIONS

Clemens Bechinger et al., "Photoelectrochromic windows and displays", Nature. vol. 383.17 Oct. 1996, p. 608-p. 610.

(Continued)

*Primary Examiner* — David N Spector
(74) *Attorney, Agent, or Firm* — Jianq Chyun IP Office

(57) ABSTRACT

A printable photovoltaic electrochromic device is provided. The device includes a transparent substrate, at least one thin-film solar cell on the transparent substrate, at least one single polarity electrochromic (EC) thin film, wherein the single polarity electrochromic thin film includes a single polarity electrochromic material and a polyelectrolyte. The thin-film solar cell at least includes an anode layer, a cathode layer, and a photoelectric conversion layer between the anode layer and cathode layer, wherein a portion of the anode layer or a portion of the cathode layer is exposed from the thin-film solar cell. The single polarity electrochromic thin film covers and contacts with both the cathode layer and the anode layer.

20 Claims, 8 Drawing Sheets

(56) References Cited

OTHER PUBLICATIONS

Satyen K. Deb et al., "Stand-alone photovoltaic-powered electrochromic smart window", Electrochimica Acta 46, 2001, p. 2125-2130.

Wei Gao et al., "Approaches for large-area a-SiC:H photovoltaic-powered electrochromic window coatings", Journal of Non-Crystalline Solids 266-269, 2000, p. 1140-p. 1144.

Jyongsik Jang et al., "Fabrication of Water-Dispersible Polyaniline-Poly(4-styrenesulfonate) Nanoparticles for Inkjet-Printed Chemical-Sensor Application", Adv. Mater. 2007, 19, p. 1772-p. 1775.

Sung Jong Yoo et al., "High contrast ratio and fast switching polymeric electrochromic films based on water-dispersible polyaniline-poly(4-styrenesulfonate) nanoparticles", Electrochemistry Communications 12, 2010, p. 164-p. 167.

* cited by examiner

PRINTABLE PHOTOVOLTAIC ELECTROCHROMIC DEVICE AND MODULE

CROSS-REFERENCE TO RELATED APPLICATION

This application claims the priority benefit of Taiwan application serial no. 99141792, filed Dec. 1, 2010. The entirety of the above-mentioned patent application is hereby incorporated by reference herein and made a part of this specification.

TECHNICAL FIELD

The disclosure is related to a printable photovoltaic electrochromic device with a simple structure.

BACKGROUND

An electrochromic device is a device which is formed by conductive materials and is able to induce a reversible redox reaction through an applied electric field or current, thereby generating color change. Fabrication of an electrochromic device must meet the following characteristics. Colors shown under different voltages must be easily distinguishable, color change is fast and uniform, reversible color change of the device colors over ten thousand times, and the device has high stability. Common electrochromic devices include solid state surface confined thin film electrochromic devices or solution type electrochromic devices.

A solid state surface confined thin film electrochromic device is formed by an upper transparent substrate, a lower transparent substrate, and an electrochromic multi-layered film in between. The electrochromic multi-layered film is similar to a structure of a battery, including at least five coated/plated layers with different functions, such as a transparent conductive layer, an electrochromic layer, an electrolyte layer, an ion storage layer, and a transparent conductive layer. A solution type electrochromic device has a more simple structure, including an upper transparent conductive substrate and a lower transparent conductive substrate. By using epoxy glue, the two substrates are adhered with electrode layers facing each other, and an electrochromic organic solution is disposed in between. An ingredient of the solution includes an oxidation or reduction type small organic molecule electrochromic material, a polymer electrolyte, and a solvent.

Although electrochromic technology has been researched for years, since in a large-area electrochromic device, electrodes are located at peripheries of the device, electric field paths at a planer center and at edges of the electrochromic device have different lengths, impedance values at peripheral regions and at center regions are significantly different. Due to the difference in impedance values, concentric oval-shaped gradients of color change concentrations occur from the edges to the central region, thereby affecting uniformity of color changing effects.

In order to expand an application range of electrochromic technology, a number of studies related to combinations of photoelectric technology and solar cells provide more variable research directions. For example, U.S. Pat. No. 6,369,934B1 discloses a whole organic multi-layer photoelectrochemical device, in which a photosensitive layer and an electrochromic layer are separated at two electrodes with opposite polarity, so as to facilitate assembly of the device. Such a device may be described as having an electrochromic material embedded into a dye-sensitized solar cell. An electrochromic material thereof is $WO_3$, and the device mainly utilizes ruthenium dye. The device includes two transparent conductive substrates and a working electrode layer formed by a photosensitive material, an electrolyte layer, and an counter electrode layer formed by an electrochromic material. However, to apply such a structure to practical applications, many problems need to be overcome such as the long term stability of the photosensitive layer and the possibility of developing devices having larger sizes.

Moreover, U.S. Pat. No. 5,377,037 has disclosed a design of combining a solar cell with an electrochromic device to form one single device, which is basically manufactured by using a stacking method to combine monolithic silicon thin-film solar cells with an inorganic electrochromic device on a first conductive glass substrate, and then oppositely bonding the silicon thin-film solar cells with another transparent conductive glass substrate. Between the substrates, a liquid organic electrolyte or a solid inorganic electrolyte layer is disposed. However, an optical contrast before and after color change obtained through such a technology is relatively low, and thus color changing effect is insignificant. The transparency of the PV-EC device is improved by the incorporation of wide bandgap semitransparent amorphous silicon carbon alloy. However, as the semitransparent PV thin films become very thin, electrical short circuit occurs easily, makes it less attractive to apply the device in smart windows.

US Patent Application Publication No. 2010/0000590 A1 and U.S. Pat. No. 7,855,822 provide several liquid type photovoltaic electrochromic devices, wherein electrodes are uniformly dispersed on a whole surface of a substrate, so that a uniform electric field is formed and an electrochromic solution has a same degree of color change at different regions, thereby preventing iris effects.

Although the above patent applications improve uniformity of color change, problems of leakage easily occur, due to the electrochromic solutions and liquid electrolytes used.

SUMMARY

A printable photovoltaic electrochromic device is introduced herein. The printable photovoltaic electrochromic device at least includes a transparent substrate, a thin-film solar cell on the transparent substrate, and at least one single polarity electrochromic thin film, wherein the single polarity electrochromic thin film includes a single polarity electrochromic material and a polyelectrolyte. The thin-film solar cell at least includes an anode layer, a cathode layer, and a photoelectric conversion layer between the anode layer and the cathode layer. A portion of the anode layer or a portion of the cathode layer is exposed from the thin-film solar cell. The single polarity electrochromic thin film covers and contacts with both the cathode layer and the anode layer.

Due to the above, the single polarity electrochromic thin film according to the disclosure includes the single polarity electrochromic material and the polyelectrolyte. When used in conjunction with the thin-film solar cell in which the portion of the anode layer or the portion of the cathode layer is exposed, coloring through irradiation of light is achieved. Therefore, the printable photovoltaic electrochromic device according to the disclosure does not require extra electrolytes, so that problems of liquid leakage caused by using general electrolyte solutions are prevented, and the printable photovoltaic electrochromic device is able to be integrated into a single-layered structure, thereby reducing processing time. Furthermore, since according to the disclosure, the device is formed through coating/printing processes, if the thin-film solar cell is deposited on a flexible substrate, printing methods may be used to complete the printable photovoltaic electrochromic device according to the disclosure.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1:
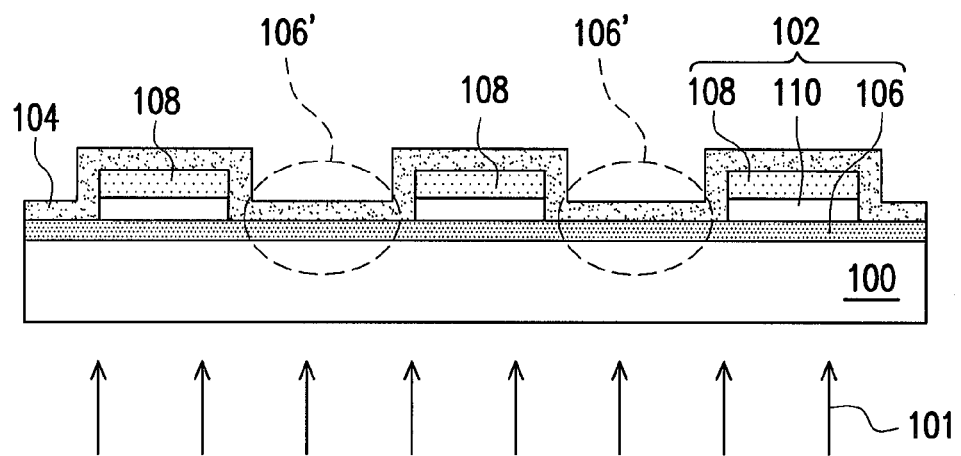
FIG. 1 is a schematic cross-sectional diagram showing a printable photovoltaic electrochromic device according to a first embodiment of the disclosure.

FIG. 1 is a schematic cross-sectional diagram showing a printable photovoltaic electrochromic device according to a first embodiment of the disclosure.

Please refer to FIG. 1, the printable photovoltaic electrochromic device according to the first embodiment is a printable photovoltaic electrochromic device with a superstrate structure. A transparent substrate 100, a thin-film solar cell 102 on the transparent substrate 100, and at least one single polarity electrochromic thin film 104 are required for color change through irradiation of light 101. The single polarity electrochromic thin film 104 includes a single polarity electrochromic material and a polyelectrolyte. The transparent substrate 100 is, for example, glass, a plastic material, or a flexible substrate. The above single polarity electrochromic material includes a positively charged or negatively charged anodic electrochromic material or cathodic electrochromic material, and the single polarity electrochromic material may be a nano structured electrochromic material, such as a nano structured metal oxide, a nano structured metal complex, or a nano structured conducting polymer. The above nano structured electrochromic material is, for example, nanoparticles, nanorods, nanowires, nanospheres, or nanotubes. The above nano structured metal oxide is, for example, $WO_3$, $V_2O_5$, $NiO_x$ or $CuO_x$. The above nano structured metal complex is, for example, a prussian blue analog or InHCF. The above nano structured conducting polymer is, for example, polyaniline nanospheres, polypyrrole (PPy) nanospheres or PEDOT nanospheres.

The polyelectrolyte included in the single polarity electrochromic film 104 may be a polyanionic electrolyte or a polycationic electrolyte. The polyanionic electrolyte may be classified into three types according to its functional group: phosphate group, carboxylic group, and sulfonic acid group. The polycationic electrolyte may be classified as having an ammonium group and a sulfuric group. For example, the polyanionic electrolyte is, for example, sodium poly(styrene sulfonate) (PSS), sodium poly(acrylic acid) (NaPA), polyacrylic acid (PAA), polymaleic acid (PMA), poly(perfluorosulfonic acid (PFSA, trademarked as NAFION®), and the polycationic electrolyte is, for example, polydiallyl dimethylammonium chloride (PDDA), polyallylamine hydrochloride (PAH), poly-L-lysine (PLL), or polyethyleneimine (PEI).

The anodic or cathodic electrochromic material included in the single polarity electrochromic film 104 includes a positively charged anodic or cathodic electrochromic material or a negatively charged anodic or cathodic electrochromic material. For example, for a PEDOT cathodic electrochromic material, a method for polymerizing PEDOT is oxidative polymerization, so that positively charged $(PEDOT)^{n+}$ is obtained after polymerization (n is a stoichiometric quantity). A polyanionic electrolyte $PSS^-$ must also exist to form the single polarity electrochromic material and polyelectrolyte $(PEDOT)^{n+}(PSS)^{n-}$. For a PANI anodic electrochromic material, a method for polymerization is also oxidative polymerization, so that positively charged $(PANI)^{m+}$ is obtained after polymerization (m is a stoichiometric quantity). A polyanionic electrolyte $PSS^-$ must also exist to form the single polarity electrochromic material and polyelectrolyte $(PANI)^{m+}(PSS)^{m-}$.

Still referring to FIG. 1, the thin-film solar cell 102 at least includes an anode layer 106, a cathode layer 108, and a photoelectric conversion layer 110 between the anode layer 106 and the cathode layer 108. A portion 106' of the anode layer 106 is exposed from the thin-film solar cell 102. A material of the anode layer 106 is, for example, a transparent conductive oxide (TCO), and a material of the cathode layer 108 is, for example, a transparent conductive oxide and a metal (such as silver, aluminum, and platinum). The single polarity electrochromic thin film 104 covers both the cathode layer 108 and the exposed portion 106' of the anode layer 106, so that when the printable photovoltaic electrochromic device is irradiated by sunlight 101, electron-hole pairs are immediately generated in the thin-film solar cell 102, and redox reactions occur in the single polarity electrochromic thin film 104. Through ion exchange provided by the polyelectrolyte, color change in the single polarity electrochromic thin film 104 is achieved. Hence, by including the above printable single polarity electrochromic thin film 104, the printable photovoltaic electrochromic device according to the first embodiment achieves effects such as not requiring extra electrolytes and having a simple manufacturing process and structure.

Moreover, if the transparent substrate 100 is a flexible substrate, according to the present embodiment, the thin-film solar cell may be first deposited on the flexible substrate, and the printable photovoltaic electrochromic device in FIG. 1 may be then completed by a coating method such as roll to roll coating. Hence the printable photovoltaic electrochromic device is suitable for commercial mass production.

Figure 2:
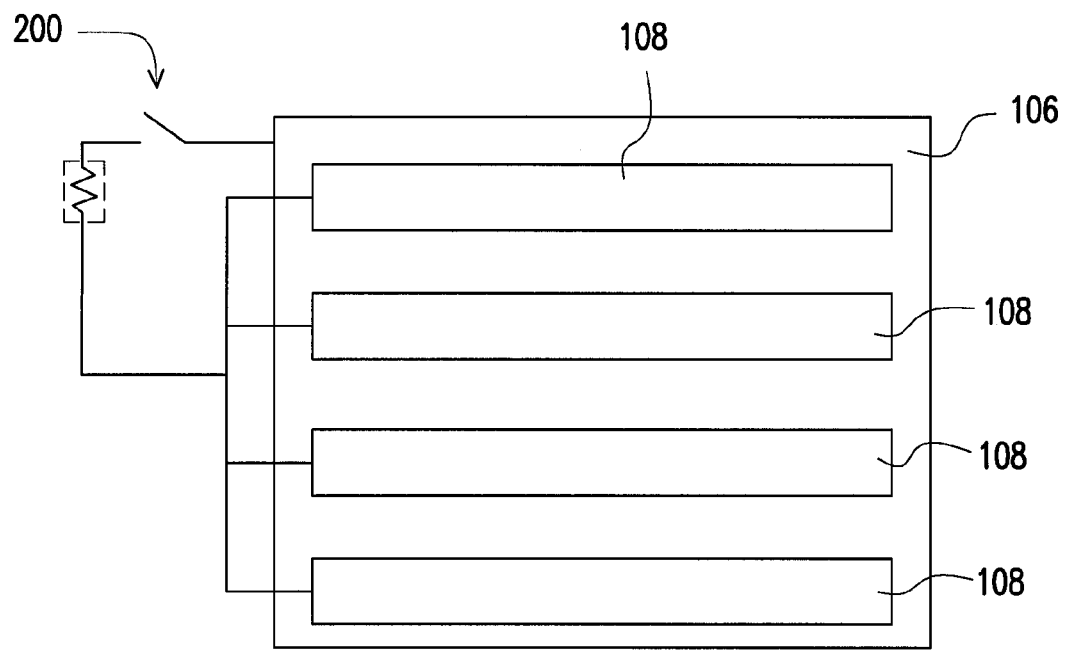
FIG. 2 is a schematic top diagram showing the printable photovoltaic electrochromic device in FIG. 1.

In FIG. 1, the anode layer 106 of the thin-film solar cell 102 is continuous, and a circuit layout thereof is shown in FIG. 2, wherein the thin-film solar cell which is connected in a parallel fashion, and other elements in FIG. 1 are omitted. The cathode layer 108 in FIG. 2 is individually connected to an output switch layout 200. Such a continuous anode layer 106 may increase a total current generated by the thin-film solar cell. However, the disclosure is not limited to this configuration.

The thin-film solar cell 102 according to the first embodiment may be a silicon thin-film solar cell, a CIGS thin-film solar cell, a CdTe thin-film solar cell, a CIGS tandem thin-film solar cell, or a CdTe tandem thin-film solar cell, among which the more stable type is the silicon thin-film solar cell, such as an a-Si thin-film solar cell, an a-Si/mc-Si tandem thin-film solar cell, or an a-Si/a-Si tandem thin-film solar cell.

Figure 3:
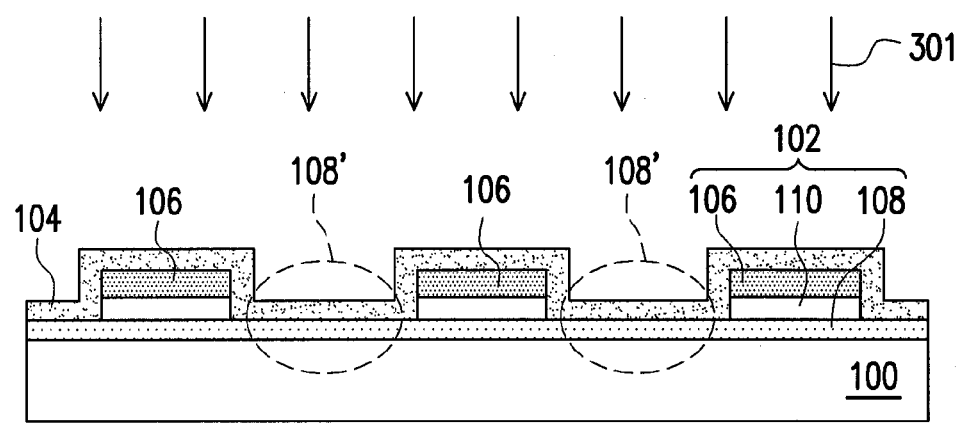
FIG. 3 is a schematic cross-sectional diagram showing a printable photovoltaic electrochromic device according to a second embodiment of the disclosure.

FIG. 3 is a schematic cross-sectional diagram showing a printable photovoltaic electrochromic device according to a second embodiment of the disclosure, wherein same reference numerals as those according to the first embodiment represent same or similar elements.

Please refer to FIG. 3, the printable photovoltaic electrochromic device according to the present embodiment is a printable photovoltaic electrochromic device with a substrate structure. The thin-film solar cell 102 at least includes an anode layer 106, a cathode layer 108, and a photoelectric conversion layer 110 between the anode layer 106 and the cathode layer 108. A portion 108' of the cathode layer 108 is exposed from the thin-film solar cell 102, and light 301 is incident from the single polarity electrochromic thin film 104. Since the printable photovoltaic electrochromic device according to the second embodiment is a device with the substrate structure, the color tint of a single polarity electrochromic thin film 104 may affect the thin-film solar cell 102 power generation, so that the printable photovoltaic electrochromic device according to the second embodiment may be applied to devices that require periodical color change.

Figure 4A:
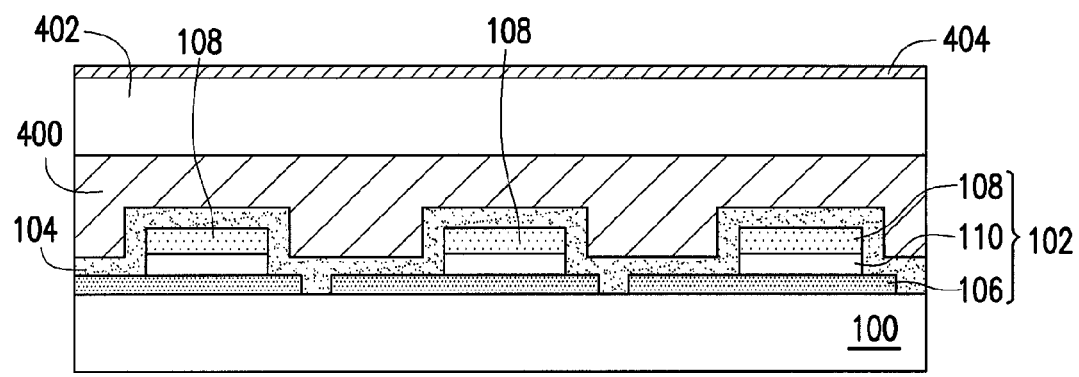
FIG. 4A is a schematic cross-sectional diagram showing another printable photovoltaic electrochromic device according to the first embodiment of the disclosure.
Figure 4B:
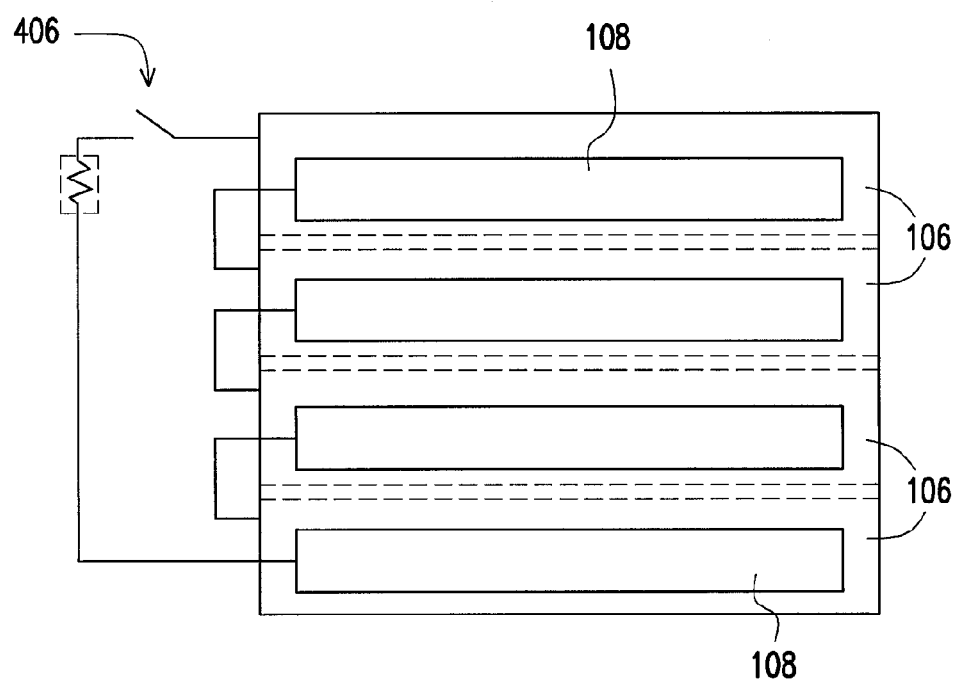
FIG. 4B is a schematic top diagram showing the printable photovoltaic electrochromic device in FIG. 4A.

In addition, FIGS. 4A and 4B are respectively a schematic cross-sectional diagram and a schematic top diagram showing another printable photovoltaic electrochromic device according to the first embodiment of the disclosure, wherein the thin-film solar cell is connected in series.

Please refer to both FIGS. 4A and 4B. Different portions of the anode layer 106 of the thin-film solar cell 102 are arranged in a striped manner and do not contact each other. The single polarity electrochromic thin film 104 is capable of color change through irradiation of light by covering both the anode layer 106 and the cathode layer 108 of the thin-film solar cell 102. Each of the portions of the anode layer 106 is connected to the cathode layer 108 of another thin-film solar cell, and is connected to the an output switching layout 406.

Moreover, after forming the single polarity electrochromic thin film 104, an encapsulating material 400 may cover the single polarity electrochromic thin film 104 (as shown in FIG. 4A). Subsequently, a transparent non-conductive substrate 402, such as glass, plastic, or a flexible substrate may cover the encapsulating material 400. A reflective film 404, such as a silver or aluminum thin film, may be formed on a surface of the transparent non-conductive substrate 402, so as to form a mirror surface.

Figure 5:
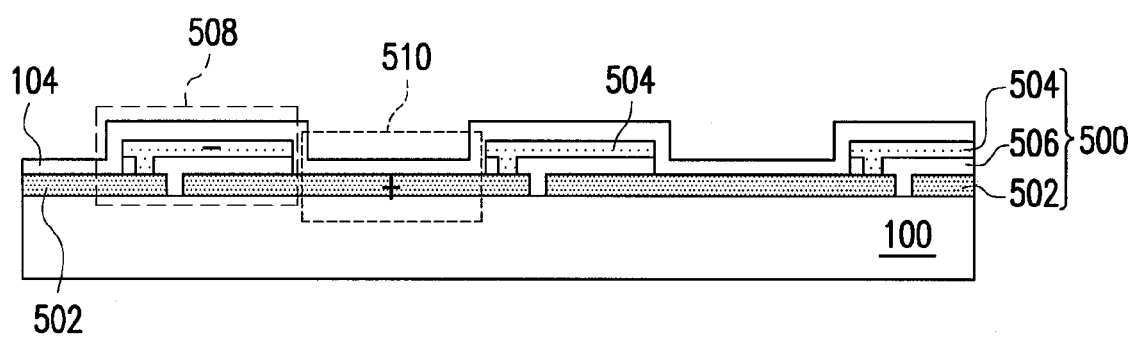
FIG. 5 is a schematic cross-sectional diagram showing a printable photovoltaic electrochromic module according to a third embodiment of the disclosure.

FIG. 5 is a schematic cross-sectional diagram showing a printable photovoltaic electrochromic module according to a third embodiment of the disclosure, wherein same reference numerals as those according to the first embodiment represent same or similar elements.

Please refer to FIG. 5, a printable photovoltaic electrochromic module according to the third embodiment includes the transparent substrate 100, a thin-film solar cell 500 on the transparent substrate 100, and at least one single polarity electrochromic thin film 104, wherein the single polarity electrochromic thin film 104 includes the single polarity electrochromic material and the polyelectrolyte, which are described in the previous embodiment. The thin-film solar cell 500 is a monolithic integrated module, which is formed by a plurality of anode layers 502 on a surface of the transparent substrate 100, a plurality of cathode layers 504 on the anode layers 502, and a photoelectric conversion layer 506 between the anode layers 502 and the cathode layers 504. The anode layers 506 in each of the thin-film solar cells 500 are connected to the cathode layers 504 of another thin-film solar cell 500, so that series connection between the thin-film solar cells 500 is achieved. Materials of each of the above layers are described in the previous embodiment.

If the single polarity electrochromic thin film 104 in FIG. 5 is a positively charged anodic or cathodic electrochromic material, a polyanionic electrolyte is required for ion exchange in regions 508 and 510, so that no extra electrolytes or a double polarity electrochromic thin film are required. The single polarity electrochromic thin film 104 only includes the positively charged anodic or cathodic electrochromic material and the polyanionic electrolyte in one single thin film; in contrast to that of a conventional electrochromic device structure which requires multiple layers of electrolyte, ion storage layer and double polarity electrochromic thin film layers to achieve charges neutrality. Therefore, even if a plurality of thin-film solar cells 500 in FIG. 5 is connected in series, since the positively charged anodic or cathodic electrochromic material in the single polarity electrochromic thin film 104 intermixed with the polyanionic electrolyte to provide ion exchange in the regions 508 and 510. Problems of excessive oxidation or excessive reduction, caused by imbalance of charges in the anodic or cathodic electrochromic material (due to voltage differences in the series integrated structure) do not occur, so that the printable photovoltaic electrochromic device does not have problems of non-uniform coloring.

Figure 6A:
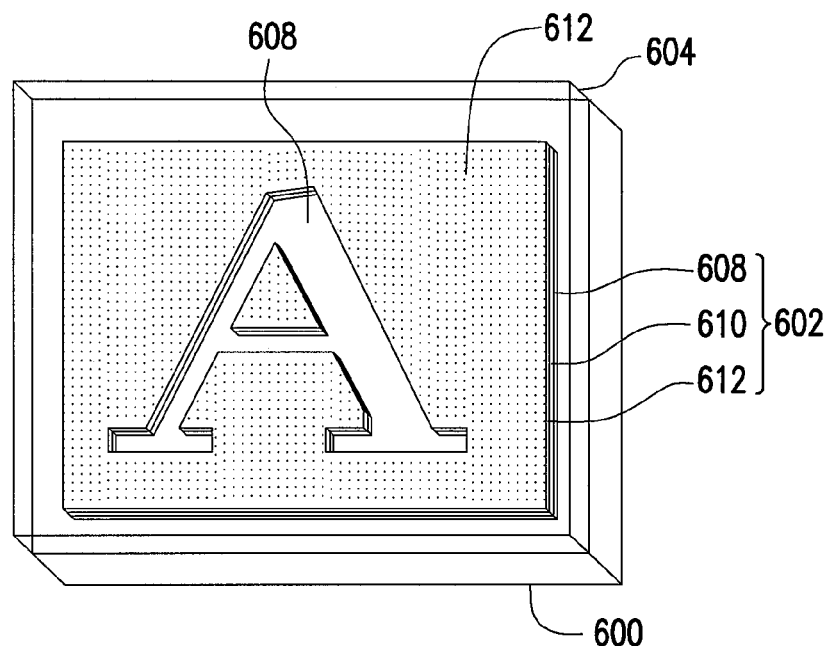
FIG. 6A is a schematic perspective diagram showing a printable photovoltaic electrochromic device according to a fourth embodiment of the disclosure.
Figure 6B:
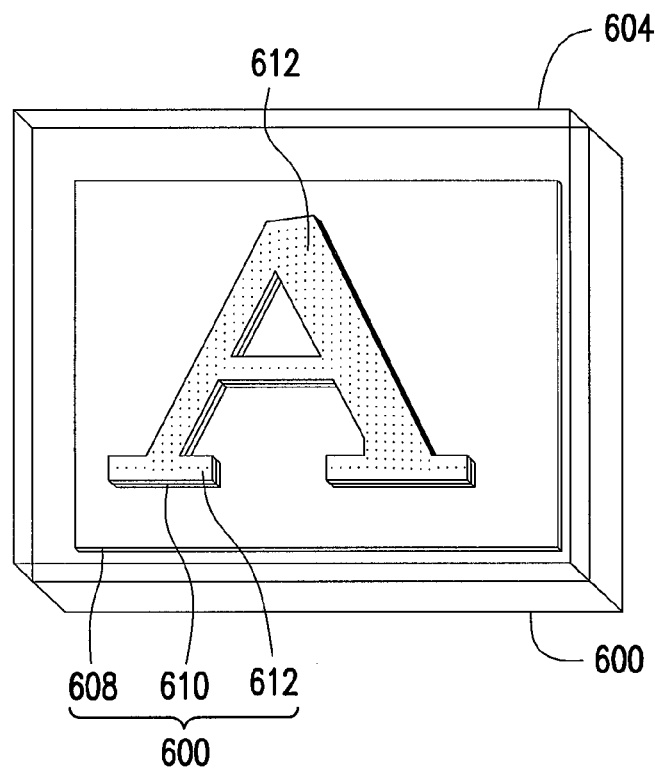
FIG. 6B is a schematic perspective diagram showing another printable photovoltaic electrochromic device according to the fourth embodiment of the disclosure.

FIG. 6A is a schematic perspective diagram showing a printable photovoltaic electrochromic device according to a fourth embodiment of the disclosure. FIG. 6B is a schematic perspective diagram showing another printable photovoltaic electrochromic device according to the fourth embodiment of the disclosure.

Please refer to FIGS. 6A and 6B. A printable photovoltaic electrochromic device according to the fourth embodiment includes a transparent substrate 600, a thin-film solar cell 602 on the transparent substrate 600, and at least one single polarity electrochromic thin film 604, wherein the single polarity electrochromic thin film 604 includes the single polarity electrochromic material and the polyelectrolyte, which are described in each of the previous embodiments. The thin-film solar cell 602 at least includes an anode 608, a photoelectric conversion layer 610, and a cathode 612. A method of forming the patterned thin-film solar cell 602 includes laser scribing and sand blasting, so as to remove portions of the photoelectric conversion layer 610 and the cathode 612. A type of the thin-film solar cell 602 and materials of the transparent substrate 600, the anode 608, the photoelectric conversion layer 610, and the cathode 612 are described in the first embodiment.

If the single polarity electrochromic thin film 604 in FIG. 6A or 6B is a positively charged anodic or cathodic electrochromic material with a polyanionic electrolyte, when the anodic electrochromic material in the single polarity electrochromic thin film 604 changes color, the polyanionic electrolyte provides for ion exchange in the single polarity electrochromic thin film 604 above the anode 608 and the cathode 612, so that no extra electrolytes or a double polarity electrochromic thin film are required.

The following experiments are provided to prove the effectiveness described in the disclosure. In the following experiments, a silicon thin-film solar cell and a silicon thin-film solar cell module are applied as examples.

Experiment 1: Fabrication of a Single Polarity Electrochromic Thin Film 0.6 mmole of aminobenzene monomer is added into 20 ml of dionized water (DIW) which contains 0.5 M HCl, and 1.0 g of poly sodium styrenesulfonate (PSS) is added into 20 ml of dionized water. After stirring the above two solutions for two hours, 0.7 mmole of ammonium persulfate (APS) is added into the mixture solution as an oxidant, and the solution is stirred for 12 hours at 700 rpm at room temperature, so as to obtain a PANI/PSS mixture containing positively charged polymeric nanospheres of the anodic electrochromic material PANI and the polyanionic electrolyte PSS. The following is a chemical equation of the preparation process.

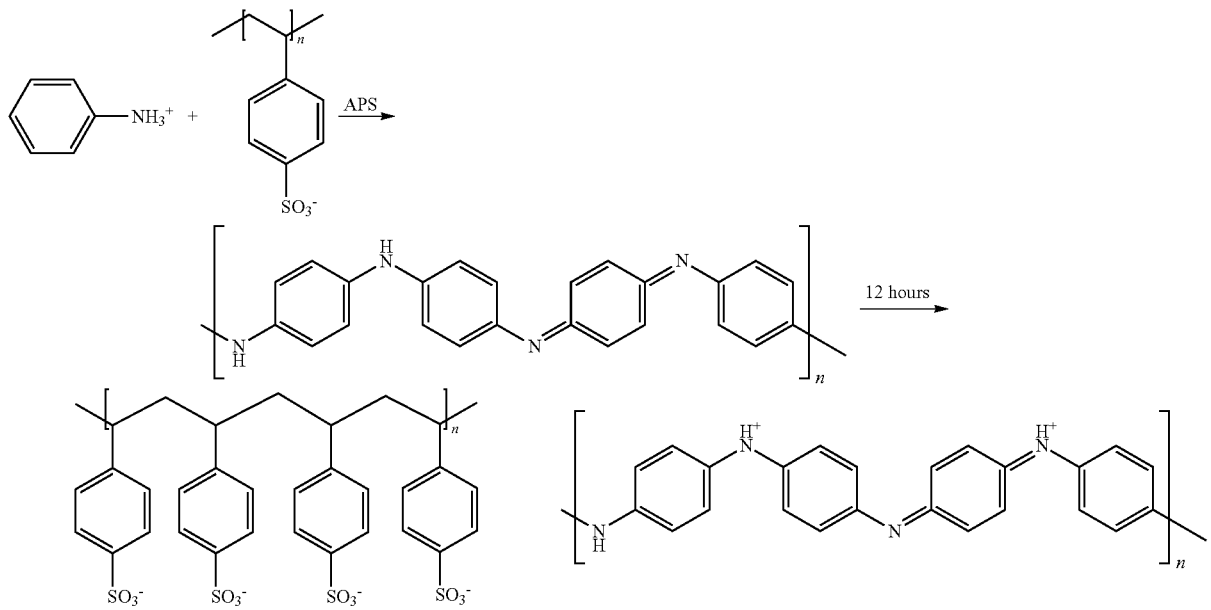

The above method of synthesizing the PANI nanoshperes and the polyanionic electrolyte PSS is based on the method of synthesis described in the journal Advanced Materials, 19, 1772-1775 (2007), which contains the article "Fabrication of water-dispersible polyaniline-poly(4-styrenesulfonate) nanoparticles for inkjet printed chemical sensor application."

Figure 7:
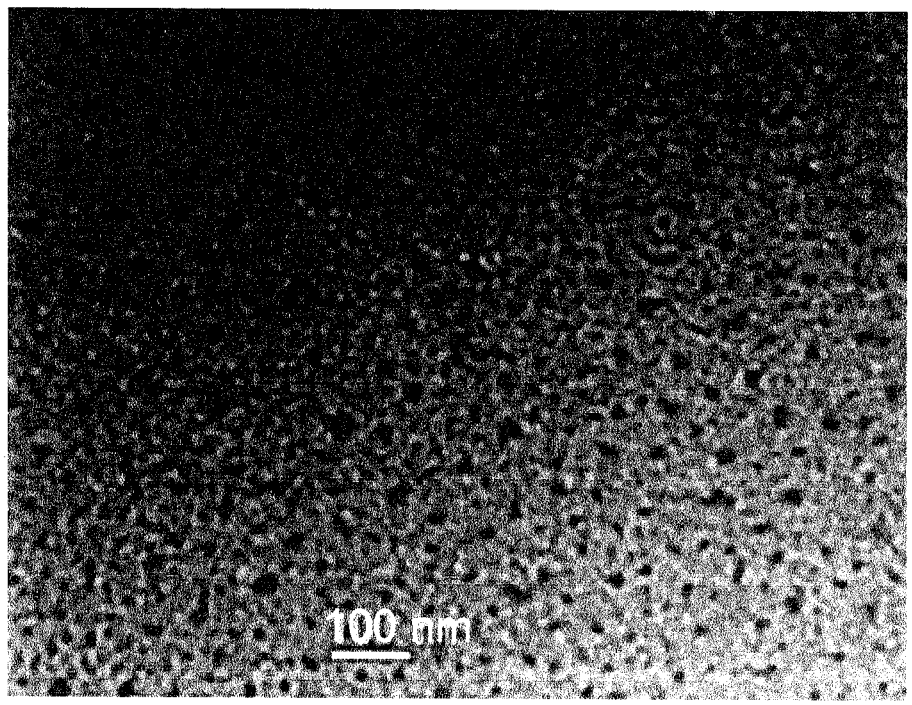
FIG. 7 is a TEM photograph of a PANI/PSS single polarity electrochromic thin film from experiment 1.

Afterwards, the PANI/PSS mixture is coated onto a glass substrate. After drying, a PANI/PSS single polarity electrochromic thin film is obtained. Through observation with a TEM, the PANI/PSS single polarity electrochromic thin film includes the PANI nanospheres, as shown in FIG. 7.

Figure 8:
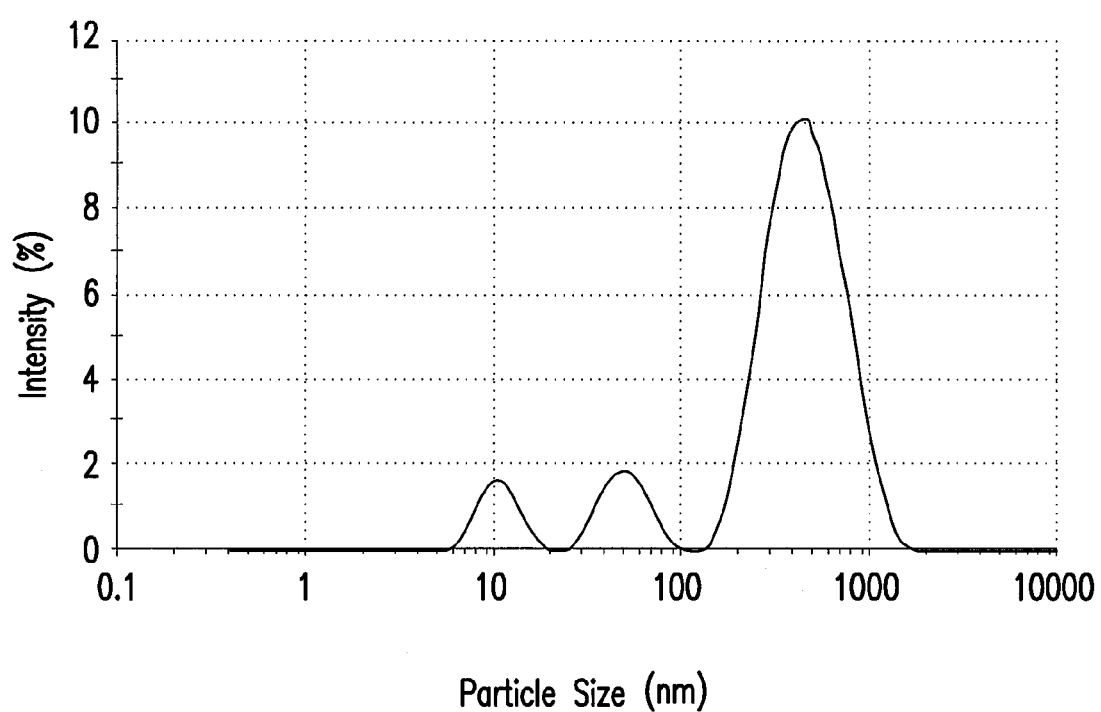
FIG. 8 is a diagram showing a curve which represents sizes of PANI nanospheres.

FIG. 8 is a diagram showing a curve which represents sizes of PANI nanospheres which are measured with a dynamic light scattering (DLS) instrument. The amount of PSS affects the sizes of the nanospheres. According to the measurement results in the present experiment, three peaks of the curves are approximately located at 10.7 nm, 51.0 nm, and 488.1 nm, so that the sizes of the nanospheres approximately range from 10 nm to 500 nm.

The following chemical equation shows a mechanism of color change in the polymeric nanospheres of the anodic electrochromic material which includes the PANI nanospheres and the polyanionic electrolyte PSS.

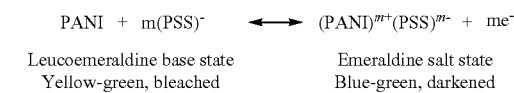

Leucoemeraldine base state  Emeraldine salt state
Yellow-green, bleached  Blue-green, darkened In the above chemical equations, "m" is a stoichiometric quantity.

Experiment 2: Fabrication and Examination of the Printable Photovoltaic Electrochromic Device A 5 cm×6 cm transparent glass substrate is prepared, and a silicon thin-film solar cell such as the one in FIG. 1 is fabricated on the glass substrate, wherein an area of an anode and a cathode of each stripe-shaped silicon solar cell is 5 cm×0.5 cm. An anode layer is a TCO, and a cathode layer is a TCO/Ag. An IV curve of such a silicon thin-film solar cell is:

$V_{oc}$=0.93 V, $J_{sc}$=12.3 mA/cm$^2$, FF=73.23%, $P_{max}$=20.94 mW, and a power generation efficiency is 8.38%.

The PANI/PSS mixture obtained in experiment 1 is printed onto a silicon thin-film solar cell module. After drying, a PANI/PSS single polarity electrochromic thin film with a thickness of approximately 100 nm is obtained.

When the above device is irradiated by sunlight, in three minutes, the PANI/PSS single polarity electrochromic thin film on the surface of the transparent anode layer starts to change color, gradually turning from yellow-green to blue-green.

Experiment 3: Fabrication and Examination of the Printable Photovoltaic Electrochromic Module A 4 cm×3 cm transparent glass substrate is prepared, and a silicon thin-film solar cell module such as the one in FIG. 5 is fabricated on the glass substrate, wherein an area of an anode and a cathode of each of the silicon thin-film solar cells is 4 cm×0.5 cm. The silicon thin-film solar cell module includes three sets of silicon thin-film solar cells, an anode layer is a TCO, and a cathode layer is a TCO/Ag. An IV curve of such a silicon thin-film solar cell module is: Voc=3.98 volts, Isc=26.57 mA, F.F %=64.94%、PwrMax=69.09 mW, and a power generation efficiency is 5.23%.

The PANI/PSS mixture obtained in experiment 1 is coated onto the silicon thin-film solar cell module. After drying, a PANI/PSS single polarity electrochromic thin film with a thickness of approximately 100 nm is obtained.

When the above device is irradiated by sunlight, in three minutes, the PANI/PSS single polarity electrochromic thin film on the surface of the transparent anode layer starts to change color, gradually turning from yellow-green to blue-green.

In addition, if a time of irradiation is extended (from three minutes to one hour), the PANI/PSS single polarity electrochromic thin film is maintained in blue-green, and no problems of non-uniform color occurs.

Experiment 4: Fabrication and Examination of the Printable Photovoltaic Electrochromic Module The silicon thin-film solar cell module is fabricated by the method described in experiment 3, and the silicon thin-film solar cell repeatedly undergoes the PANI/PSS spin coating and drying steps in experiment 1, so that three printable photovoltaic electrochromic devices which have three, five, and ten layers of the PANI/PSS single polarity electrochromic thin film are fabricated.

When the above three device are irradiated by sunlight, in three minutes, the PANI/PSS single polarity electrochromic thin film on the surface of the transparent anode layer starts to change color, gradually turning from yellow-green to blue-green. Therefore, the PANI/PSS single polarity electrochromic thin film, whether having one or up to ten layers, has functions of color change through irradiation of light.

Experiment 5: Fabrication of a Single Polarity Electrochromic Thin Film 100 mg of PSS is added into 50 ml of distilled water which includes 1.0 M NaCl, and the mixture is stirred for six hours and set aside for subsequent use. 26 µl of EDOT monomer is added to a distilled water solution of 0.2 M $H_2SO_4$, and the mixture is stirred for two hours. The solutions from the above two steps are mixed and stirred for one hour, and 56 mg of APS is added therein. After stirring at room temperature for two hours, the mixture is heated to 80° C. and further stirred for six hours. A resulting blue liquid is a PEDOT/PSS mixture.

The method in experiment 3 is used to fabricate the silicon thin-film solar cell module, and the above PEDOT/PSS mixture is spin coated on the silicon thin-film solar cell according to the method in experiment 2. After drying, a PEDOT/PSS single polarity electrochromic thin film with a thickness of approximately 100 nm is obtained.

When the above device is irradiated by sunlight, in five minutes, the PEDOT/PSS single polarity electrochromic thin film on the surface of the cathode layer starts to change color, turning from light blue to dark blue.

The following chemical equation shows a mechanism of color change in the polymeric nanospheres of the electrochromic material which includes the PEDOT nanospheres and the polyanionic electrolyte PSS.

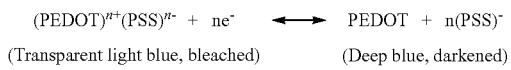

$(PEDOT)^{n+}(PSS)^{n-} + ne^- \longleftrightarrow PEDOT + n(PSS)^-$
(Transparent light blue, bleached)    (Deep blue, darkened)

In the above chemical equation, "n" represents a number of charges.

According to the above experiments, by following the disclosure, effects of coloring through irradiation of light are achieved.

Moreover, an output switch layout can be added to the printable photovoltaic electrochromic device according to the disclosure. The switch of the printable photovoltaic electrochromic device may be formed by the following methods.

Figure 9:
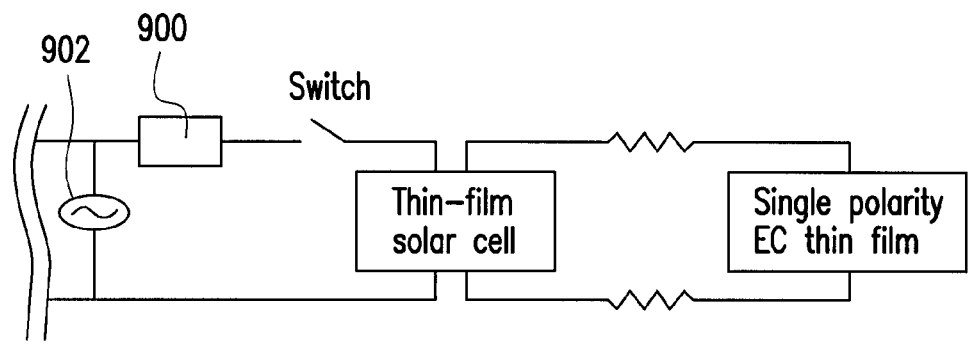
FIG. 9 is a schematic circuit diagram showing an arrangement of a printable photovoltaic electrochromic device and an output switch according to the disclosure.

1. By using a DC/AC inverter 900, a current generated by the thin-film solar cell is converted to an AC current, which is able to be used as a commercial power 902 to be supplied to general electrical appliances, as shown in FIG. 9.

Figure 10:
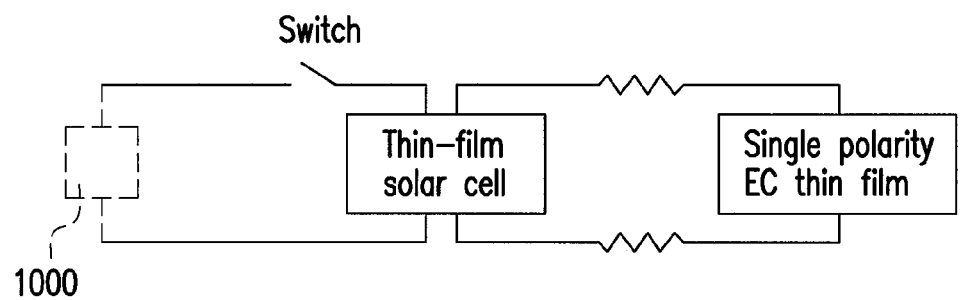
FIG. 10 is a schematic circuit diagram showing an arrangement of a printable photovoltaic electrochromic device and another output switch according to the disclosure.

2. The current generated by the thin-film solar cell is channeled to a DC charge storage device 1000 (which is able to be subsequently used as a battery to supply power to general DC electrical appliances), as shown in FIG. 10.

Figure 11:
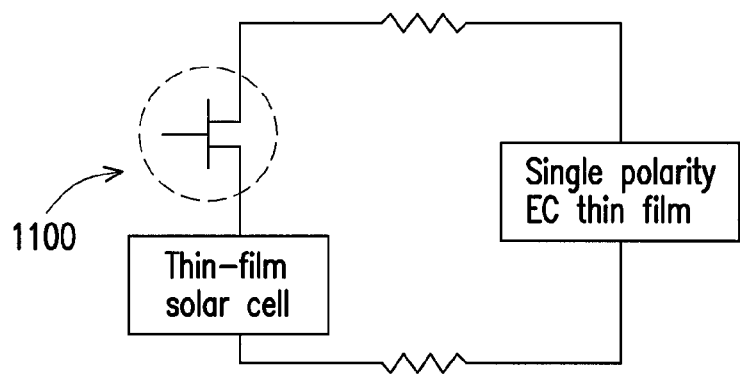
FIG. 11 is a schematic circuit diagram showing an arrangement of a printable photovoltaic electrochromic device and a thin-film transistor tube according to the disclosure.

3. Through thin film transistor (TFT) processes and the like, thin film transistors 1100 are fabricated at two terminals of the anode layer and the cathode layer of the thin-film solar cell to be used as switches, so as to individually control on/off of each of the thin film solar cells and an external circuit, thereby achieving an actively controlled electrochromic device, as shown in FIG. 11.

In summary, according the disclosure, through device designs (i.e. the thin-film solar cell in which the portion of the anode layer or the portion of the cathode layer is exposed from the thin-film solar cell), and through the usage of the single polarity electrochromic thin film which includes the single polarity electrochromic material and the polyelectrolyte, coloring through irradiation of light is achieved. Problems of non-uniform color change through irradiation of light do not occur on the monolithic integrated structure thin-film solar cell module which has the single polarity electrochromic material coated/printed thereon. This is different from conventional device structures of double polarity electrochromic materials with electrolytes, which must include designs for balancing charges in the double polarity electrochromic layer to achieve uniform color change. In other words, the printable photovoltaic electrochromic device according to the disclosure is a fully solid state device structure, so that problems of liquid leakage caused by using liquid electrolytes are prevented, and the printable photovoltaic electrochromic device may be integrated into a single-layered structure, thereby reducing processing time. Furthermore, since according to the disclosure, the device is formed through coating processes, if the thin-film solar cell is deposited on the transparent flexible substrate, coating methods may be used to complete the printable photovoltaic electrochromic device according to the disclosure in a simple manner and in large quantities.

It will be apparent to those skilled in the art that various modifications and variations can be made to the disclosure without departing from the scope or spirit of the disclosure. In view of the foregoing, it is intended that the disclosure cover modifications and variations of this disclosure provided they fall within the scope of the following claims and their equivalents.

What is claimed is:

1. A printable photovoltaic electrochromic device, at least comprising:

a transparent substrate;

at least one thin-film solar cell, disposed on the transparent substrate, wherein the thin-film solar cell at least comprises an anode layer, a cathode layer, and a photoelectric conversion layer between the anode layer and the cathode layer, and a portion of the anode layer or a portion of the cathode layer is exposed from the thin-film solar cell; and at least one single polarity electrochromic thin film, covering and contacting with both the cathode layer and the anode layer, wherein the single polarity electrochromic thin film comprises a single polarity electrochromic material and a polyelectrolyte.

2. The printable photovoltaic electrochromic device as claimed in claim 1, wherein the printable photovoltaic electrochromic device comprises superstrate photovoltaic electrochromic device or substrate photovoltaic electrochromic device.

3. The printable photovoltaic electrochromic device as claimed in claim 1, wherein the single polarity electrochromic material comprises an anodic electrochromic material or a cathodic electrochromic material.

4. The printable photovoltaic electrochromic device as claimed in claim 1, wherein the single polarity electrochromic material comprises a nano structured electrochromic material.

5. The printable photovoltaic electrochromic device as claimed in claim 1, wherein the transparent substrate comprises a flexible substrate.

6. The printable photovoltaic electrochromic device as claimed in claim 1, further comprising a DC/AC inverter, so as to convert a current provided by the thin-film solar cell to commercial power.

7. The printable photovoltaic electrochromic device as claimed in claim 1, further comprising a DC charge storage device, so as to store a current generated by the thin-film solar cell.

8. The printable photovoltaic electrochromic device as claimed in claim 1, further comprising a thin film transistor, individually connected to two terminals of the anode layer and the cathode layer of the thin-film solar cell, so as to individually control an on or off state of the thin-film solar cell and an external circuit.

9. The printable photovoltaic electrochromic device as claimed in claim 1, wherein the at least one thin-film solar cell comprises a plurality of thin-film solar cells.

10. The printable photovoltaic electrochromic device as claimed in claim 9, wherein the thin-film solar cells are connected in series.

11. The printable photovoltaic electrochromic device as claimed in claim 1, further comprising an encapsulating material, covering the thin-film solar cell and the single polarity electro chromic material.

12. The printable photovoltaic electrochromic device as claimed in claim 11, further comprising a transparent non-conductive substrate, covering the encapsulating material.

13. The printable photovoltaic electrochromic device as claimed in claim 1, wherein the polyelectrolyte comprises a polyanionic electrolyte or a polycationic electrolyte.

14. The printable photovoltaic electrochromic device as claimed in claim 13, wherein the polyanionic electrolyte comprises sodium poly(styrene sulfonate), sodium poly (acrylic acid), polyacrylic acid, polymaleic acid, or poly(perfluoro-sulfonic acid.

15. The printable photovoltaic electrochromic device as claimed in claim 13, wherein the polycationic electrolyte is, for example, polydiallyl dimethylammonium chloride, polyallylamine hydrochloride, poly-L-lysine, or polyethyleneimine.

16. The printable photovoltaic electrochromic device as claimed in claim 4, wherein the nano structured electrochromic material comprises a nano structured metal oxide, a nano structured metal complex, or a nano structured conducting polymer.

17. The printable photovoltaic electrochromic device as claimed in claim 16, wherein the nano structured electrochromic material comprises nanoparticles, nanorods, nanowires, nanospheres, or nanotubes.

18. The printable photovoltaic electrochromic device as claimed in claim 16, wherein the nano structured metal oxide comprises $WO_3$, $V_2O_5$, $NiO_x$ or $CuO_x$.

19. The printable photovoltaic electrochromic device as claimed in claim 16, wherein the nano structured metal complex comprises a prussian blue analog or InHCF.

20. The printable photovoltaic electrochromic device as claimed in claim 16, wherein the nano structured conducting polymer comprises polyaniline nanospheres, polypyrrole nanospheres, or PEDOT nanospheres.

* * * * *